United States Patent [19]

Walters

[11] Patent Number: 4,657,146

[45] Date of Patent: Apr. 14, 1987

[54] ADJUSTABLE PRINTED CIRCUIT BOARD RACK FOR SUPPORTING PRINTED CIRCUIT BOARDS IN A HORIZONTAL OR A VERTICAL POSITION

[76] Inventor: Richard Walters, 58 Leandre St., Manchester, N.H. 03102

[21] Appl. No.: 795,601

[22] Filed: Nov. 6, 1985

[51] Int. Cl.[4] ............................................. A47G 19/08
[52] U.S. Cl. ....................................... 211/41; 211/40; 361/415
[58] Field of Search ........................... 211/41, 40, 194; 248/230; 361/415; 206/454, 445, 449, 501, 503, 504, 509

[56] References Cited

U.S. PATENT DOCUMENTS

| | | | |
|---|---|---|---|
| 3,014,594 | 12/1961 | Kerstner | 211/41 |
| 3,484,226 | 12/1969 | Golightly | 211/41 |
| 3,897,871 | 8/1975 | Zinnbauer | 211/41 |
| 3,960,268 | 6/1976 | Davis et al. | 211/41 |
| 4,184,599 | 1/1980 | Drake et al. | 211/194 |
| 4,266,465 | 4/1981 | Thomas | 211/41 |
| 4,328,897 | 5/1982 | Weiss | 211/41 |
| 4,385,781 | 5/1983 | Welsch et al. | 211/41 |
| 4,434,899 | 3/1984 | Rivkin | 211/41 |
| 4,527,222 | 7/1985 | Swingley et al. | 206/509 |

Primary Examiner—Richard J. Scanlan, Jr.
Assistant Examiner—Douglas W. Hanson
Attorney, Agent, or Firm—Sughrue, Mion, Zinn, Macpeak & Seas

[57] ABSTRACT

A series of laterally spaced elongated inverted T-shaped bars are coupled together at opposite ends by transversely extending hollow tubes projecting within thin wall tube clamps fixed to the upper surface of the bars at respective ends to form a printed circuit board carrier or rack. The clamps may be loosened for spreading the inverted T-shaped support bars to conform to the width of the printed circuit board whose edges lie adjacent a slotted spline or rail with the edges of the board supported by the base of the inverted T-shaped bars. Alternatively, the plurality of printed circuit boards may be inserted within aligned transverse slots within the splines. Headed bolts projecting upwardly through the ends of the bar, each bear a nut for clamping the thin wall tube clamp onto the top of the base portion of the bars on the ends remote from the spline. The recessed RW 10-14-85 bolt heads in the rack RW 10-14-85 receive the threaded ends of bolts of an underlying a rack to permit interlocking stacking of printed circuit boards on respective racks as a multiple board vertically stacked array. Extended length tubes may join three or more bars affixed to the tubes at longitudinally spaced positions to form an extended length rack bearing a plurality of printed circuit boards in horizontal side-by-side fashion between given pairs of such bars.

6 Claims, 4 Drawing Figures

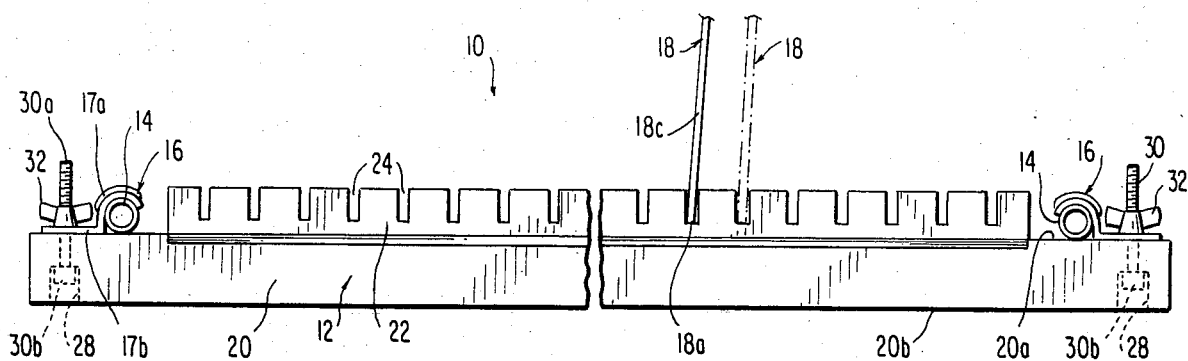
FIG. 2
FIG. 3
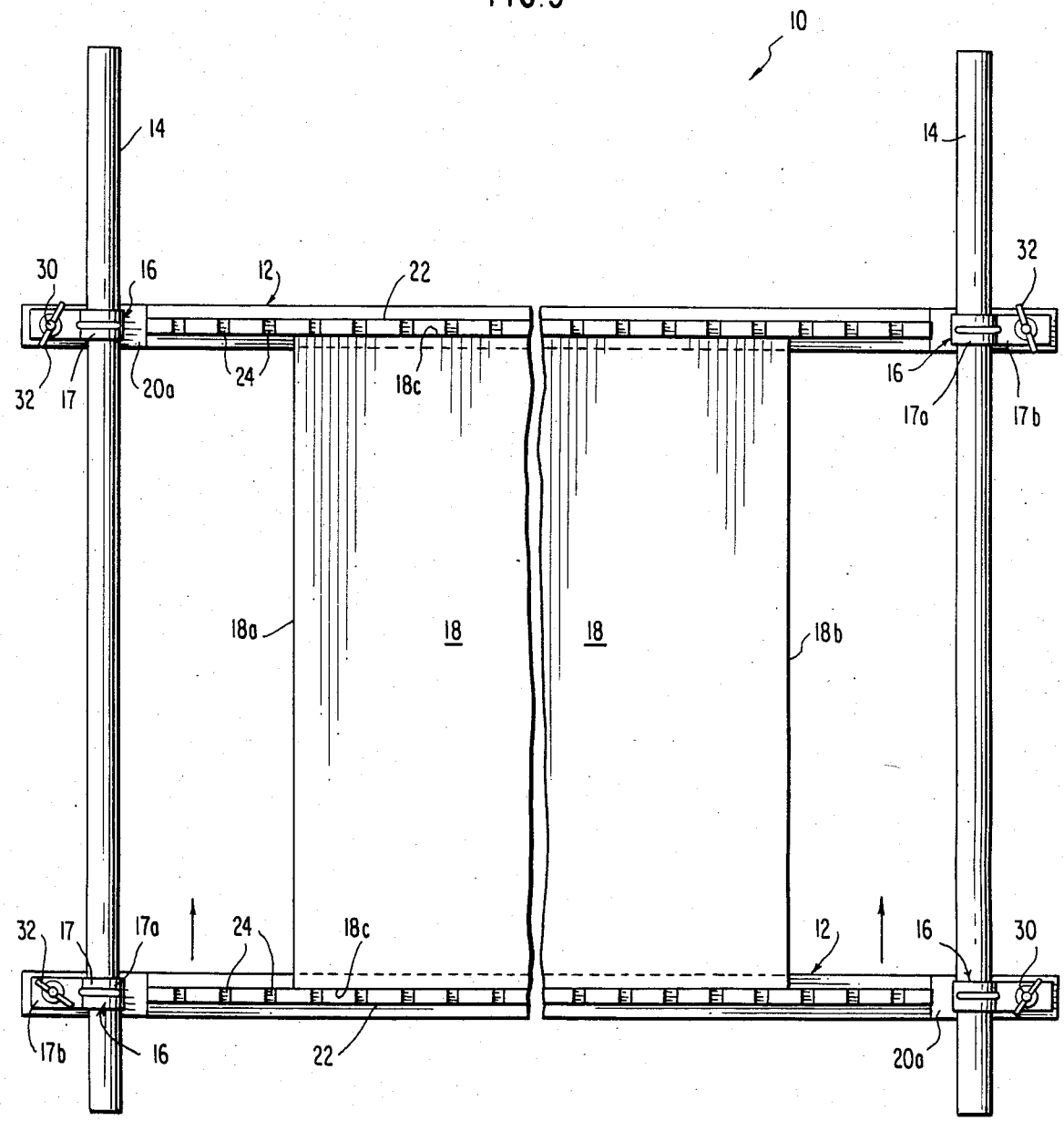

ADJUSTABLE PRINTED CIRCUIT BOARD RACK FOR SUPPORTING PRINTED CIRCUIT BOARDS IN A HORIZONTAL OR A VERTICAL POSITION

FIELD OF THE INVENTION

This invention relates to printed circuit board racks and more particularly to racks capable of adjustment to receive printed circuit boards of varying sizes and which may support the printed circuit boards in either horizontal or near vertical position.

BACKGROUND OF THE INVENTION

Printed circuit board carriers or racks are used in the manufacture of printed circuit boards themselves as well as during assembly of components to the printed circuit boards. Conventionally, printed circuit board racks store printed circuit boards either vertically or horizontally and the racks are not adjustable for the very purpose of providing a firm base for support of the printed circuit boards during processing, so that tipping does not occur. Further, such racks lack the ability to facilitate handling and do not have handles which extend at least the width of the board being transported to facilitate ease in pick-up and deposit of the racks during a station change. Such racks known to the applicant do not have means for interengaging other racks to form stacked arrays or facilitate the enlargement of the rack to handle multiple printed circuit boards particularly when the printed circuit boards are to be maintained horizontally on the rack.

Typically, such racks are constituted by an integrated structure of the form of two longitudinally extending and laterally spaced parallel bars bearing a plurality of slots or lateral notches within the upper faces of the bars so as to receive the bottom edges of generally vertically upright printed circuit boards which are maintained in parallel positions.

U.S. Pat. No. 2,921,550 teaches the use of a rack for assembling apparatus for electronic modules including printed circuit boards. Such rack permits the electronic components such as resistors to be mounted via their wires in the assembly and by soldering held to the printed circuit boards. After assembly the rack or rack components are disassembled from the circuit boards bearing the components.

U.S. Pat. No. 3,680,193 teaches a frame for positioning a number of electrical connectors for use with an automatic wire-wrapping machine. Thus the frame functions as a jig in the manufacturing or assembly process.

U.S. Pat. No. 4,098,046 constitutes top and bottom members integrally molded from plastic material having an elongated base with upstanding side walls and two sets of cantilevered ribs or bars which are separated by a distance less than the thickness of the workpiece to be slidably inserted therein and with the rib structure tending to block or impede withdrawal towards the end facilitating insertion.

U.S. Pat. No. 4,256,296 teaches a printed circuit board assembly fixture to facilitate assembly of a multiple number of printed circuit boards at the same time and comprises an angular support frame so as to enable the user to work at a comfortable angle on a work bench.

As may be appreciated from the above references, printed circuit racks may function as jigs for facilitating the manufacture and assembly of electronic components. The printed circuit boards are designed for particular functions required by the particular components being assembled or the completed electronic apparatus. In the manufacture of printed circuit boards or in the processing of such boards to facilitate the connecting of electronic components thereto, the printed circuit board rack carrying single or multiple printed circuit boards in either horizontal or vertical positions must permit and facilitate basic manufacturing operations such as baking, dipping, spraying, and assembly and fixing of electronic components to the printed circuit board or boards themselves.

It is therefore a principal object of the present invention to provide an improved printed circuit board racks which may function as a fixed rack or as a movable carrier, which may support a plurality of printed circuit boards in a near vertical position or one or more printed circuit boards in a horizontal position which, when employed as a carrier in the transport of the printed circuit boards, facilitates the handling of the carrier, which facilitates manufacturing process operations of the board or components carried thereby, which is readily adjustable to accommodate printed circuit boards of various sizes, which is simple in design, inexpensive, provides minimal contact between the rack and the printed circuit board or boards and which is rugged, easy to use, easy to pick up, chemical and heat resistant, and effective during transportation of the printed circuit boards.

SUMMARY OF THE INVENTION

The present invention is directed to a printed circuit board rack or carrier comprising at least two elongated support bars, said support bars comprising a base portion and a vertically upright rail, uniformly spaced, aligned cross slots within said rails, of a width in excess of the thickness of a printed circuit board, a pair of elongated cylindrical handles and means on the end of said bars for clamping said elongated cylindrical handles to said bar ends at longitudinally adjustable positions along said handles. As such, said bars can be spaced parallel to each other and fixedly maintained in position on said cylindrical handles by said clamping means at distances corresponding to the width of a printed circuit board fitted between the projecting rails and resting horizontally on the tops of said base portions of said bars or at a position where said rails, are spaced at a distance less than the lateral width of the printed circuit cards with a plurality of printed circuit cards slidably inserted into the aligned cross slots of respective projecting rails for maintaining the plurality of printed circuit cards in generally upright, parallel position on said rack.

The elongated cylindrical handles may comprise a hollow tube. The clamping means may comprise an inverted U-shaped, thin wall tube clamp straps having an integral, laterally projecting flat strap portion to one side thereof and wherein said bars have vertical holes drilled therethrough at opposite ends thereof, and bolts projecting through aligned holes within the flat strap portions of said thin wall tube clamps. Nuts are carried by the threaded ends of said bolts whereby a loosening of the nut permit the elongated cylindrical handles to be shifted within the thin wall tube clamps, relative to said bars, for varying the lateral spacing between bars. Wing nuts may be employed to facilitate manual release and locking of the thin wall tube clamp straps. The bars may be of inverted T-shaped configuration with the rail projecting upwardly from base portion of the bars, at the center thereof. The rack RW 10-18-85 may comprise radially enlarged holes with said heads extending inwardly from the face of the rack RW 10-18-85 remote from the threaded ends, sized slightly in excess of the diameter of the threaded ends of said bolts, such that the threaded ends of the bolts projecting above the nuts of one rack are received within the axial holes of the rack RW 10-18-85 of an immediately overlying second rack so as to mechanically interlock multiple racks together with the printed circuit boards positioned horizontally within given racks and between the projecting rails of adjacent rack bars, in vertical stacked position.

BRIEF DESCRIPTION OF THE FIGURES

FIG. 2 is a side elevational view of the printed circuit board rack of FIG. 1, with portions broken away.

FIG. 3 is a top plan view of the rack of FIG. 1 with a single printed circuit board horizontally positioned on said rack and extending between the laterally spaced support bars thereof.

DESCRIPTION OF THE PREFERRED EMBODIMENT

Figure 4:
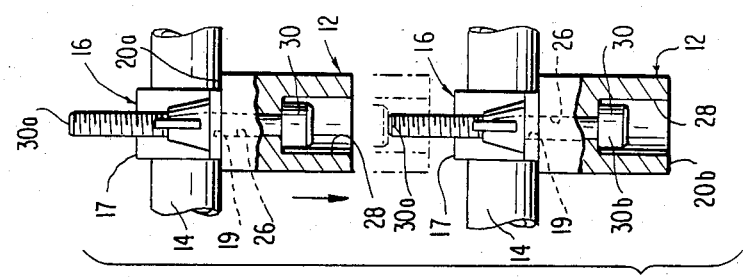
FIG. 4 is an end view of one of the lateral support bars of the rack of FIGS. 1 and 2.

Referring to the drawings, there is illustrated a single embodiment of the printed circuit board rack or carrier indicated generally at 10, and forming a preferred embodiment of the present invention. The rack is comprised of three principal components: at least two laterally spaced printed circuit board rack bars or holders 12, a pair of elongated cylindrical handles 14 and a plurality of thin wall tube clamps indicated generally at 16. Clamps 16 are carried, respectively, at opposite ends of rack bars 12. The rack 10 carries in FIG. 1 one or a plurality of conventional printed circuit boards, indicated generally at 18, which boards are of rectangular shape, having a bottom edge 18a, a top edge 18b and lateral side edges 18c. The rack bars or holders 12 are generally of inverted T-shaped configuration in transverse cross-section including a base 20 from which rises at the center thereof, and integral therewith, a vertically upright rail 22. These bars 12 may be molded of suitable plastic resistant to chemical attack. The vertical rails 22 are provided with vertical, cross slots 24 at equally spaced locations along the length of the rail 22. It is noted that the rail 22 extends over much of the length of base 20 but not at the ends of the rack bars 12. This facilitates the interconnection of laterally spaced parallel rack bars 12 by the elongated cylindrical handles 14. The handles 14 are constituted by hollow metal tubes or pipes, however, the handles could take a form other than that of a cylinder and may be solid rods. Each adjustable clamp 16 is comprised of a thin wall tube clamp strap 17 including an inverted U-shaped portion 17a integral with and extending from a flat strap portion 17b. A hole 19 is drilled through the flat strap portion 17b of a size to receive projecting threaded end 30a of a headed bolt 30. Further, each rack bar 12 has drilled, within base 20, at the respective ends, vertical holes 26 sized slightly larger than the diameter of the threaded ends 30a of bolts 30 and receive those ends. The threaded ends 30a of the bolts 30, in each instance, also pass through hole 19 within the flat strap portion 17b of the thin clamp straps 17. Preferably, a butterfly nut 32 is threaded to the projecting threaded end 30a of bolt 30 to lock the tube clamp straps 17 to the upper face of base 20 of the rack 12, at respective ends thereof, with the inverted U-shaped strap portion 17a gripping the outer periphery of the handle 14 and pressing it against the top face 20a of rack bar base 20. The arcuate curvature of the inverted U-shaped portion 17a of the strap 17 conforms to the curvature of the hollow tube handle 14. Rack RW 10-18-85 is contersunk for head of bolt and threaded bolt of lower rack to interlock. As may be seen in FIG. 4, a plurality of racks 10 may be stacked one upon each other and interlocked in position through the interlock created by the projecting end 30a of an underlying rack bolt 30 at each bolt location, i.e., at the four corners of the rack, received within enlarged holes 28 within the rack bars 12 of the bolts 30 of an overlying rack 10. Unless the printed circuit boards 18 have a thickness approximately equal to the width of the cross slots 24, upright printed circuit boards will tilt slightly from the vertical as shown in FIG. 1.

Figure 1:
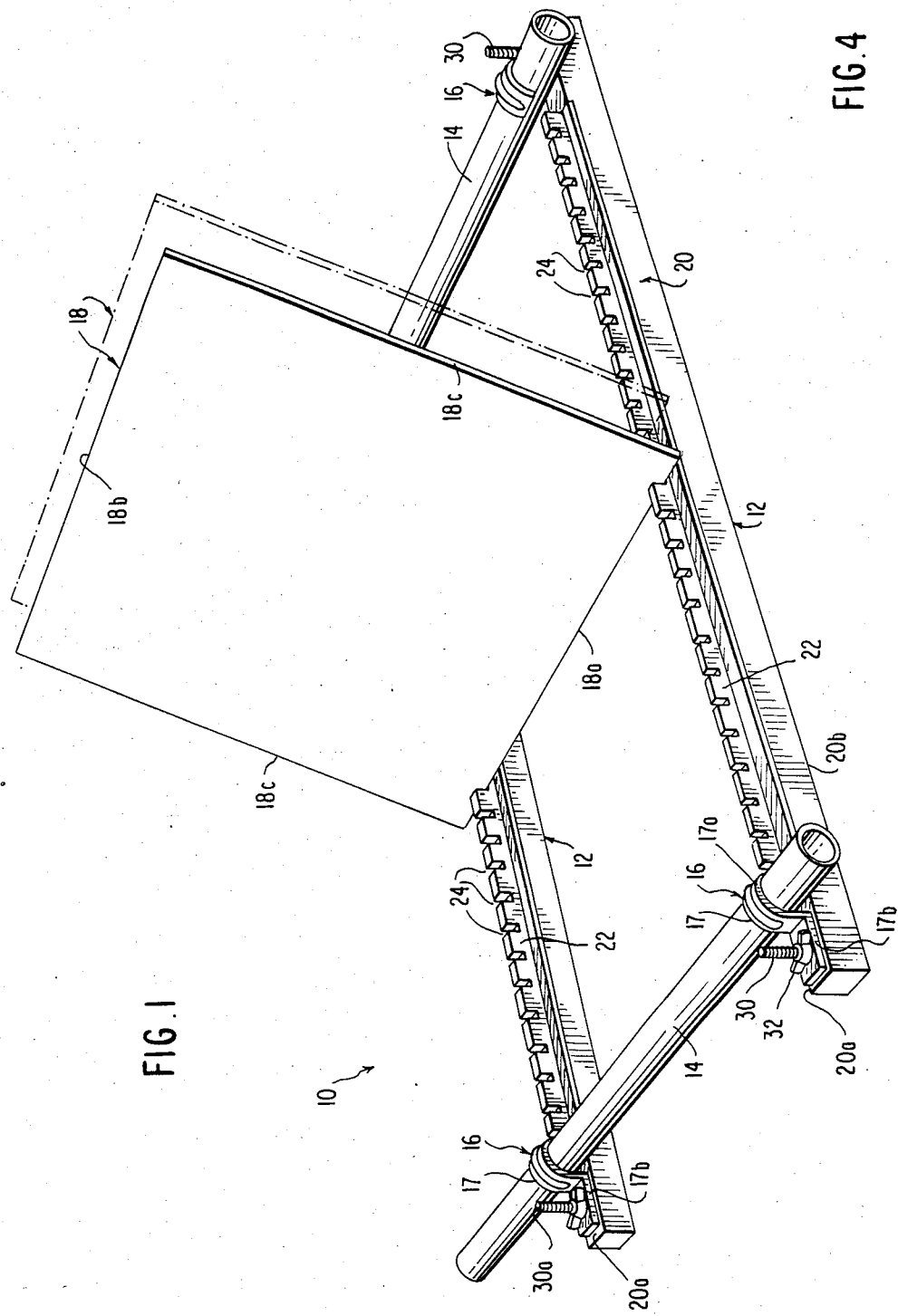
FIG. 1 is a perspective view of a printed circuit board rack forming a preferred embodiment of the present invention and illustrated in a mode supporting one or more printed circuit boards in a generally vertically upright position.

Referring now to FIG. 3, which is a perspective view of the rack 10, this figure shows the support bars or holders 12 spaced slightly further apart than as shown in FIG. 1; this being accomplished by loosening of butterfly nuts 32 on threaded ends 30a of the respective bolts 30 for one of the rack bars 12 whereupon the thin wall tube clamps 16 permit the cylindrical handles 14 to be shifted axially in a given direction by sliding those handles within clamps 16 mounted to the lowermost bar 12. The rails 22 may separate from each other a distance which in excess of the lateral width of the printed circuit card 18 between its lateral edges 18c. This permits a card 18 to be positioned horizontally as shown in FIG. 4 with its side edges 18c resting on the top surface 20a of the rack bars 12 and between the upright rails 22. Reclamping of the handle 14 to the lowermost rack bar 12 in FIG. 4 completes a rigid, right angle rectangular assembly of the two handles and two rack bars to again create a rack with the requisite capability of supporting one or more printed circuit boards 18 horizontally securely positioned on the rack 10 and capable of facilitating processing of the printed circuit board 18 itself or electronic components assembled thereto. The handles 14 may take the form of metal (or other material) tubes or pipes whose diameter is sized to the curvature of the inverted U-shaped portions 17a of the thin wall tube clamp straps 17.

As may be appreciated, the printed circuit board rack 10 enables process operators to transport boards either vertically or horizontally between process operations or to facilitate automated transport and handling thereof. The tubular handles 14 allow easy pick-up and adjustment of the carrier or rack while giving stability to the support of the printed circuit boards and minimizing tipping of the rack during transport. The rack 10 may be employed as a fixed component of the processing equipment or may function as a carrier in transporting the printed circuit cards between processing stations. The tubular handles 14 may of varying length and permit mounting of a series of laterally spaced parallel rack bars or holders 12 at longitudinally spaced positions corresponding to circuit boards 18 of various sizes and permitting the circuit boards to be positioned on the rack either horizontally, vertically or near vertically.

When supporting the printed circuit boards in a vertical or near vertical orientation, the rack is readily adjustable to the width or length of the boards for maximum stability of the rack during processing or transport. A plurality of rack bars 12 or splines may be employed in a single assembly in excess of the two illustrated in the drawings. The tubular handles 14 facilitate pick-up of the racks. The racks with the printed circuit boards in vertical position may be used in wet processing areas, for baking and dipping because of the minimal surface area of the rack. Additionally if the individual parts break or are deformed, they can easily be replaced without the necessity to dispose of the whole rack 10.

Further benefits occur in using the racks with the printed circuit boards horizontally positioned on the bases 20 of the rack bars and between the upright rails of respective bars. The boards can be locked into the rack by the pressure of the rack bar upright rails forming the rack splines. The boards are held with minimum contact area between the printed circuit boards and the rack to limit interference with baking or conformal coat drying. The tubular handles 14 facilitate ease in handling of the rack and the printed circuit boards carried thereby, the rack is adjustable to meet the size of the printed circuit board or boards carried thereby, and the rack can be used for assembly of components to the board is desired. Racks containing unsoldered assemblies can be interlocked for transportation and are easily separated after transport. Further the vertical grooves within the rack splines formed by the slots within the vertical rails of the rack bars may be used to hold wires placed in the boards for soldering. As may be appreciated the same rack can be used in the vertical orientation of the printed circuit boards after wave soldering for storage space reduction. The rack does not require any adaptation except for lateral adjustment of the bars to meet the lateral width limitations of the racks supported thereby.

In either position the rack 10 may be used for processing the printed circuit boards in different operations, i.e., for soldering or the like. The rail handles 14 being of tubular form may be used to suspend the rack by inserting four tongues (not shown) into the open ends of the two tubes 14 at each end, respectively.

While the rack bars 12 have been illustrated in a solid rectangular bar form, of inverted T-shaped configuration, and they may be hollow, at least within their bases 20.

It may be appreciated that nuts other than butterfly nuts may be employed for tightening down the straps 17 of the thin wall tube clamps 16.

While the invention has been illustrated with reference to a particular embodiment, it will be obvious to one skilled in the art that various changes and modifications therein can be made thereto without departing from the spirit and scope thereof.

I claim:

1. A low profile printed circuit board rack comprising at least two elongated support bars, said support bars each comprising a base portion and a vertically upright rail narrower than said base portion and offset from the edge of base portion facing the opposite support bar, uniformly spaced, aligned cross slots of a width in excess of the thickness of an upwardly open printed circuit board extending transversely through said rails, a pair of elongated cylindrical handles and means on the end of said bars for adjustably clamping said elongated cylindrical handles to said bars at right angles to the bars and at longitudinally adjustable positions along said handles such that said bars can be spaced parallel to each other and fixably maintained in position on said cylindrical handles by said clamping means at distances corresponding to the width of a printed circuit board fitted between the projecting rails with opposed edges of the printed circuit board resting horizontally on the tops of said base portions of said bars and between the projecting rails, or a position where said rails, are spaced at a distance less than the lateral width of the printed circuit board such that a printed circuit board may be slidably inserted on edge into aligned cross slots of respective projecting rails to maintain a plurality of printed circuit boards in generally upright, spaced parallel positions on said rack.

2. The printed circuit board rack as claimed in claim 1 wherein said cylindrical handles comprise hollow tubes.

3. The printed circuit board rack as claimed in claim 2 wherein said clamping means comprise inverted U-shaped, thin wall tube clamp straps having an integral, laterally projecting portion to one side thereof and said laterally projecting portion having a hole therethrough, and wherein said bars have vertical holes drilled therethrough at opposite ends thereof and wherein bolts project through aligned holes within the flat strap portions of the thin wall tube clamp straps and said support bars at said ends, and a nut carried by the threaded end of each of said bolts such that loosening of the nuts permit the elongated cylindrical handles to be shifted within the inverted U-shaped thin wall tube clamp straps relative to said bars for varying the lateral spacing between the bars.

4. The printed circuit board rack as claimed in claim 3, wherein said nuts comprise wing nuts to facilitate manual release and locking of the thin wall tube clamp straps about the hollow tubes and the hollow tubes against the tops of said bars at the ends thereof.

5. The printer circuit board rack as claimed in claim 4, wherein said bars are of inverted T-shaped configuration with the rails integral with and projecting upwardly from a base portion of the bar at the lateral center thereof.

6. The printed circuit board rack as claimed in claim 3, wherein said bolts comprise radially enlarged head, said vertical holes within the said rack bars comprise counter bores within the faces of said bars remote from said rail sized in excess to the diameter of said radially enlarged heads of said bolts and being larger than said bolt heads such that threaded ends of bolts projecting above the nuts of one rack may be received within the counterbores within an immediately overlying second rack so as to mechanically interlock multiple racks together with the printed circuit boards positioned horizontally within given racks and between the projecting rails of adjacent rack bars, in vertical stacked position.

* * * * *